(12) United States Patent
Lin

(10) Patent No.: US 7,895,747 B2
(45) Date of Patent: Mar. 1, 2011

(54) METHOD FOR MANUFACTURING A HEAT PIPE WITH A PLANISHED END SURFACE

(75) Inventor: Chung-Zen Lin, Taipei (TW)

(73) Assignee: Neobulb Technologies, Inc. (BN)

( * ) Notice: Subject to any disclaimer, the term of this patent is extended or adjusted under 35 U.S.C. 154(b) by 512 days.

(21) Appl. No.: 11/887,426

(22) PCT Filed: Mar. 28, 2006

(86) PCT No.: PCT/CN2006/000521
§ 371 (c)(1),
(2), (4) Date: Sep. 28, 2007

(87) PCT Pub. No.: WO2006/102838
PCT Pub. Date: Oct. 5, 2006

(65) Prior Publication Data
US 2009/0126908 A1 May 21, 2009

(30) Foreign Application Priority Data
Mar. 28, 2005 (CN) .................... 2005 1 0062451

(51) Int. Cl.
*B21D 53/02* (2006.01)
(52) U.S. Cl. .............................. 29/890.032; 29/890.03; 29/890.04; 72/352; 72/367.1; 72/368; 72/370.01; 165/104.11; 165/104.33
(58) Field of Classification Search ............ 29/890.032, 29/890.03, 890.04; 72/352, 367.1, 368, 370.01; 165/104.11, 104.33
See application file for complete search history.

(56) References Cited

U.S. PATENT DOCUMENTS

| 4,434,640 | A | 3/1984 | Walter |
| 6,827,133 | B1 | 12/2004 | Luo |
| 7,334,337 | B2 * | 2/2008 | Matsuura ..................... 29/898 |

FOREIGN PATENT DOCUMENTS

| CN | 2526894 Y | 1/2002 |
| CN | 1566888 A | 6/2003 |
| DE | 2130822 | 1/1973 |
| TW | 466329 | 8/2001 |

(Continued)

OTHER PUBLICATIONS

English Abstract for Taiwan Patent Application No. 466329.

(Continued)

*Primary Examiner*—Rick K Chang
(74) *Attorney, Agent, or Firm*—Thomas, Kayden, Horstemeyer & Risley, LLP

(57) ABSTRACT

The invention is to provide a method for planishing a sealed end of a pipe body for making a heat pipe. According to a preferred embodiment of the method of the invention, the sealed end of the pipe body is fixed within a female mold. Then, a male mold is inserted into the pipe body. By use of the male mold, the sealed end of the pipe body with respect to the female mold is stamped to form a planished surface at the sealed end of the pipe body. Whereby after the heat pipe is finished, an electronic device is capable of being mounted on the planished surface at the sealed end of the heat pipe.

11 Claims, 9 Drawing Sheets

FOREIGN PATENT DOCUMENTS

| | | |
|---|---|---|
| TW | 466329 A | 8/2001 |
| TW | 510961 A | 11/2001 |
| TW | 466329 | 12/2001 |
| TW | M252900 Y | 2/2004 |
| TW | 593957 | 6/2004 |
| WO | 2004038759 | 5/2004 |

OTHER PUBLICATIONS

Office Action dated May 19, 2010 in related Vietnamese Patent Application.

International Search Report for PCT/CN2006/000521 dated Jul. 6, 2006.

English Abstract of TW593957.

European Search Report in related European Patent Application, dated Sep. 27, 2010.

* cited by examiner

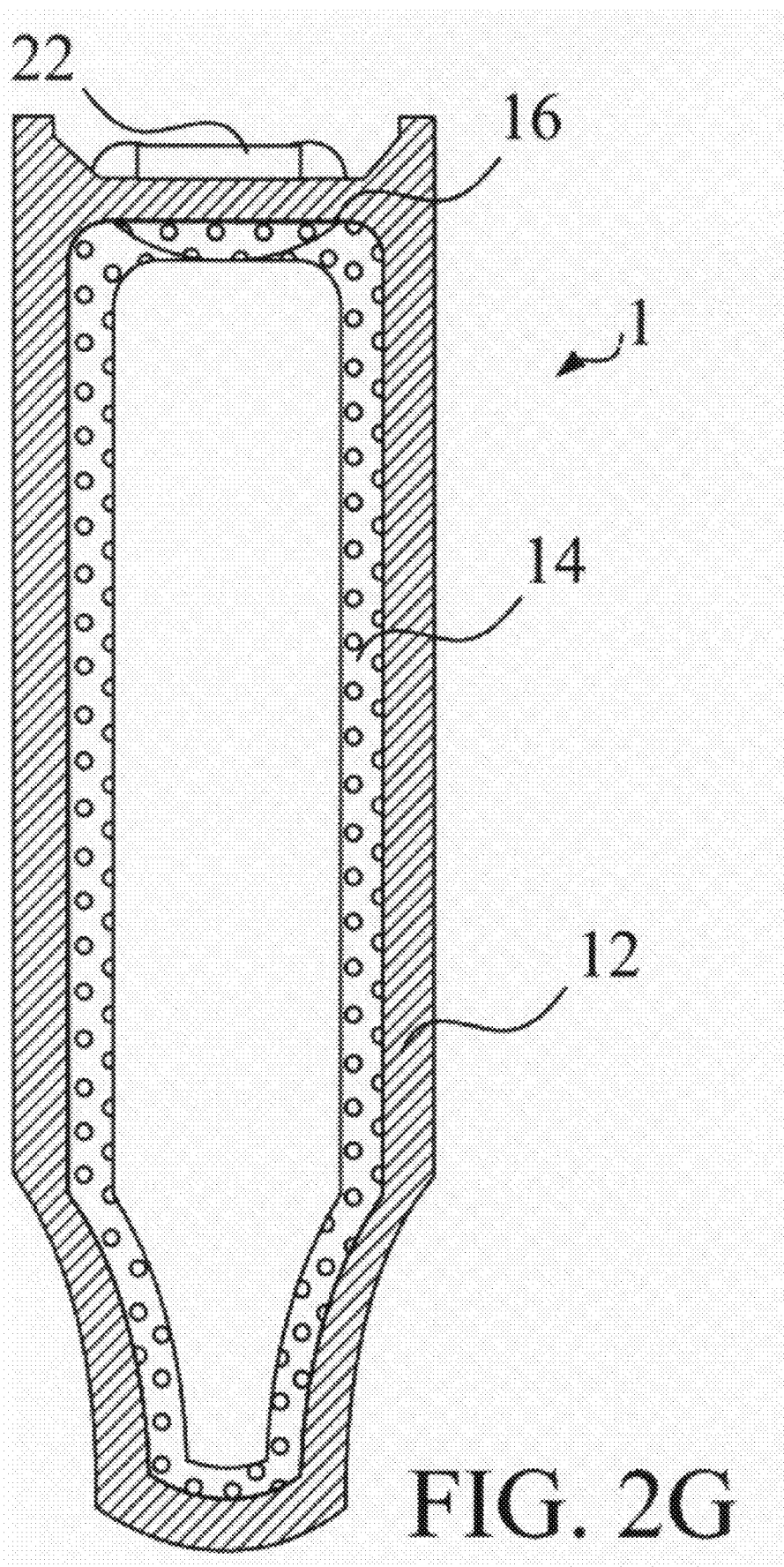

METHOD FOR MANUFACTURING A HEAT PIPE WITH A PLANISHED END SURFACE

BACKGROUND OF THE INVENTION

1. Field of the Invention

The present invention relates to a heat pipe, which has a planished end surface, and a method for planishing a sealed end of the heat pipe. Particularly, an electronic device can be flatly mounted on the planished end surface of the sealed end of the heat pipe.

2. Description of the Prior Art

With the progress of science and technology, the technologies of many electronic products all face problems of heat dissipation but can not break through. For example, a great deal of heat is generated by the central processing unit of a computer; the heat will have harmful effect on the whole system if the heat is not removed. Heat pipe plays a major role in the heat dissipating function of the central processing unit of a computer.

The prior method for manufacturing sintered heat pipe is to seal an end of a metal pipe by fusing in high temperature. Then, a metal bar is placed into the pipe, and metal powder is filled into the pipe. After the sintering process, the manufacturing of the heat pipe is finished by pulling out the metal bar. The sealed end of the metal pipe, which is manufactured by the method, is perfectly round and thicker than the circumferential wall, and the endpoint of the inner wall is lacking in capillarity. Therefore, the applications of the heat pipe nowadays are confined to the circumferential wall of the pipe rather than its end portion.

Accordingly, a scope of the present invention provides a heat pipe that has a planished end surface and a method for planishing a sealed end of the heat pipe. Thereby, an electronic device can be flatly mounted on the planished end surface of the sealed end of the heat pipe.

SUMMARY OF THE INVENTION

In order to achieve the above-mentioned purposes and solve the disadvantages discussed previously, the present invention provides a heat pipe that has a planished end surface and a method for planishing a sealed end of the heat pipe. Thereby, an electronic device can be flatly mounted on the planished end surface of the sealed end of the heat pipe.

The present invention provides a heat pipe that has a planished end surface, and thereby an electronic device can be flatly mounted on the planished end surface of the sealed end of the heat pipe. The heat pipe includes a sealed metal pipe and a porous capillary diversion layer. The metal pipe has a space in vacuum, a working fluid is in the space, wherein the planished end surface is formed on the outer wall of an sealed end of the metal pipe. The porous capillary diversion layer is disposed in the space, and it covers and includes the inner wall of the sealed end of the metal pipe.

A method for planishing a sealed end of the heat pipe, according to the present invention, provides a female mold and a male mold. The female mold has a flat bottom surface and is adapted to receive the sealed end of the pipe body. The male mold has a flat top surface corresponding to the bottom surface of the female mold, and the male mold is also adapted to be inserted into the pipe body from the open end of the pipe body. First, fix the sealed end of the pipe body within the female mold and insert the male mold into the pipe body. Then, by use of the male mold, press the sealed end of the pipe body with respect to the female mold to form a planished end surface at the sealed end of the pipe body.

The present invention uses stamping process to form a planished surface on an end of the heat pipe, and it disposes a porous capillary diversion layer to cover the planished end of the inner wall for the working fluid to smoothly circulate. Therefore, an electronic device can be flatly mounted on the planished end surface of the sealed end of the heat pipe and has good heat dissipating effect.

The advantage and spirit of the invention may be understood by the following recitations together with the appended drawings.

BRIEF DESCRIPTION OF THE APPENDED DRAWINGS

FIG. 2A to FIG. 2G illustrate the manufacturing process of the heat pipe of the first embodiment according to the present invention.

DETAILED DESCRIPTION OF THE INVENTION

The present invention provides a heat pipe that has a planished end surface and a method for planishing a sealed end of the heat pipe. Particularly, an electronic device can be flatly mounted on the planished end surface of the sealed end of the heat pipe.

The heat pipe of the present invention includes a sealed metal pipe and a porous capillary diversion layer. The metal pipe has a space in vacuum, and a working fluid is in the space, wherein the planished end surface is formed on the outer wall of a sealed end of the metal pipe. The porous capillary diversion layer is disposed in the space, and it covers and includes the inner wall of the sealed end of the metal pipe. The planished end surface of the sealed metal pipe is formed by a stamping process.

Figure 1A:
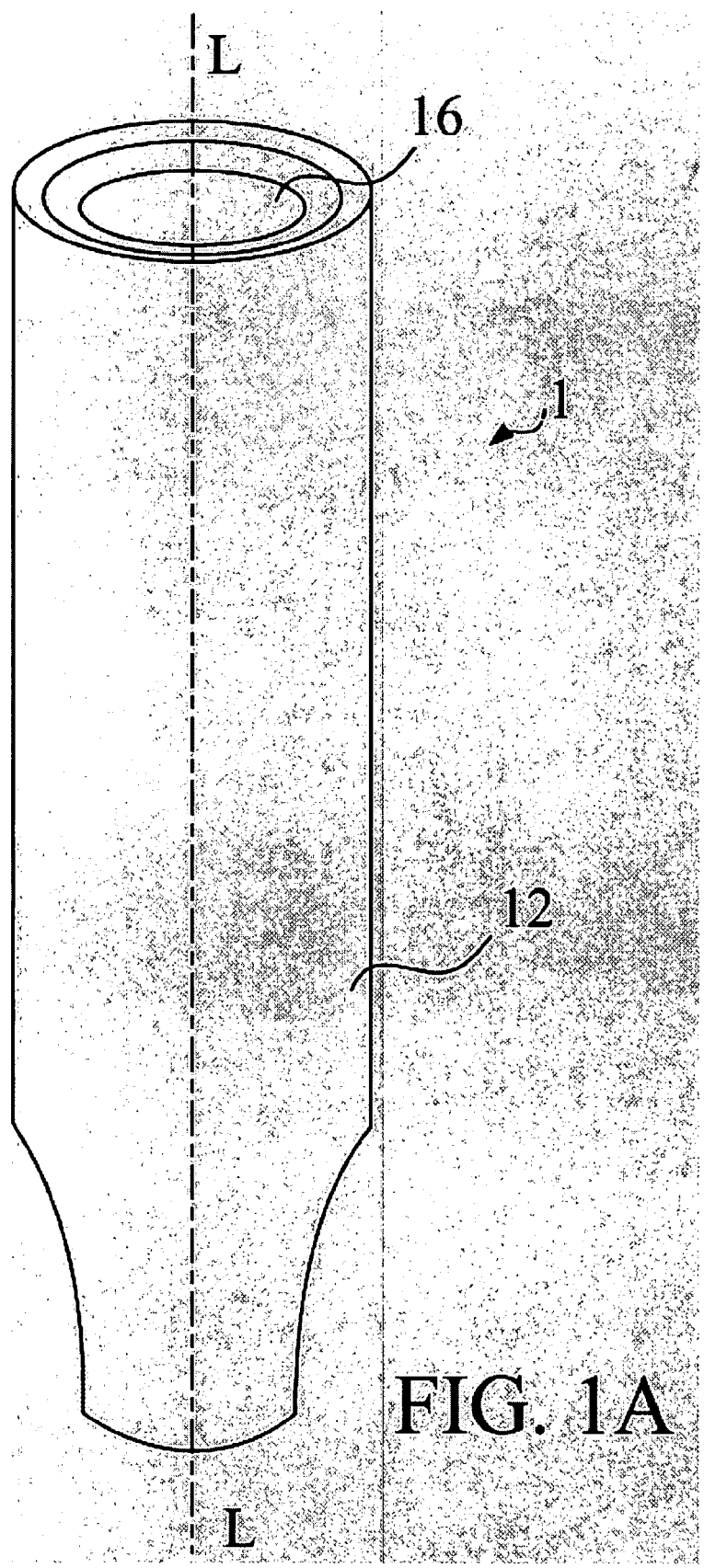
FIG. 1A is a schematic diagram of the external view of a heat pipe.

Referring to FIG. 1A, FIG. 1A is a schematic diagram the external view of a heat pipe. As shown in FIG. 1A, the heat pipe 1 includes a sealed metal pipe 12 and a planished sealed end 16.

Figure 1B:
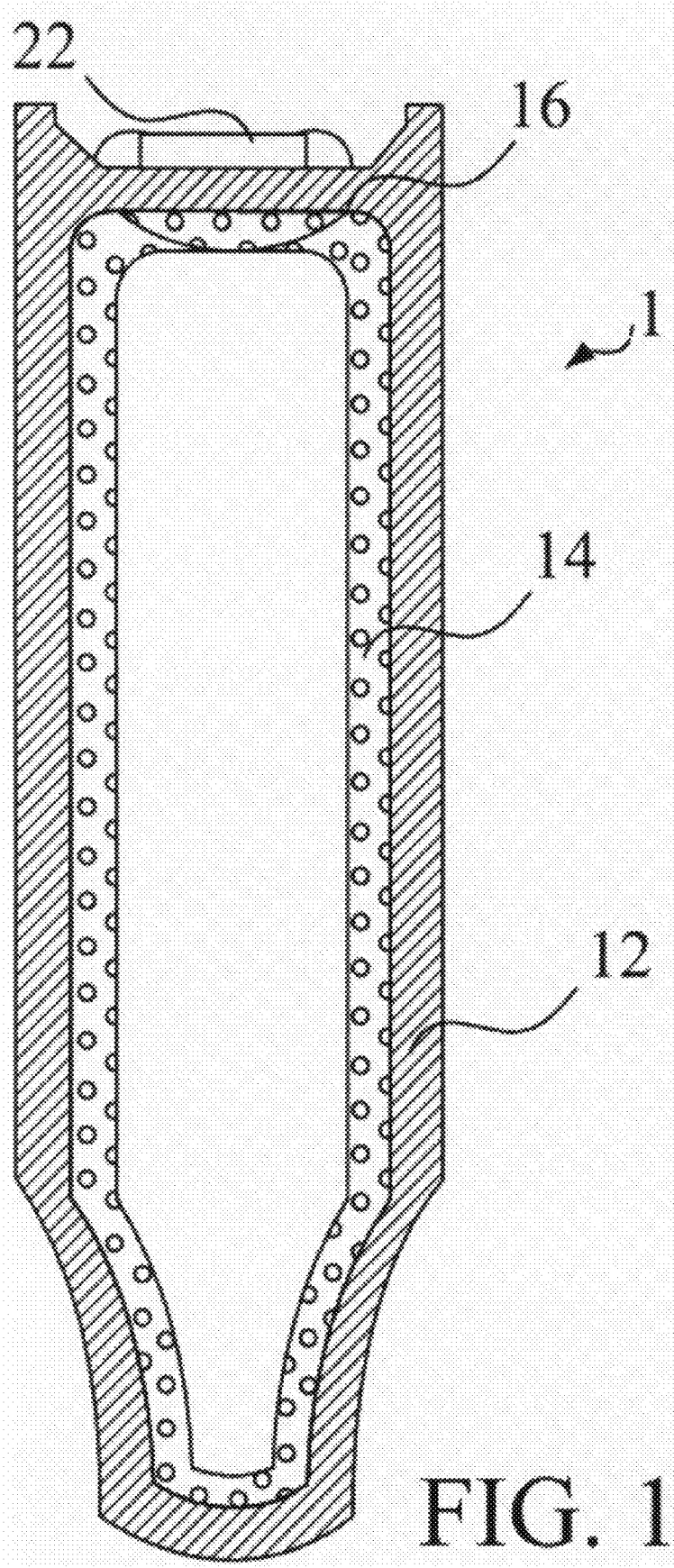
FIG. 1B is a sectional diagram along the L-L line in FIG. 1A for illustrating the inner structure of a heat pipe.

FIG. 1B is a sectional diagram along the L-L line in FIG. 1A for illustrating the inner structure of a heat pipe. As shown in FIG. 1B, according to the first embodiment the present invention, the heat pipe 1 further includes a porous capillary diversion layer 14. The metal pipe 12 has a space in vacuum, and a working fluid is in the space. The porous capillary diversion layer 14 is disposed in the space, and it covers and includes the inner wall of the sealed end 16 of the metal pipe 12. An electronic device 22 is mounted to the sealed end surface 16, such as a light emitting diode, a laser diode, or an integrated circuit.

The method for planishing a sealed end of a pipe body for making a heat pipe will be described blow. Referring to FIG. 2A to FIG. 2G, FIG. 2A to FIG. 2G illustrate the manufacturing process of the heat pipe of the first embodiment according to the present invention.

First, provide a pipe body, a female mold, and a male mold. The pipe body has an open end. The female mold has a flat bottom surface, and the female mold is adapted to receive the sealed end of the pipe body. The male mold has a flat top surface corresponding to the bottom surface of the female mold, and the male mold is adapted to be inserted into the pipe body from the open end of the pipe body.

Figure 2A:
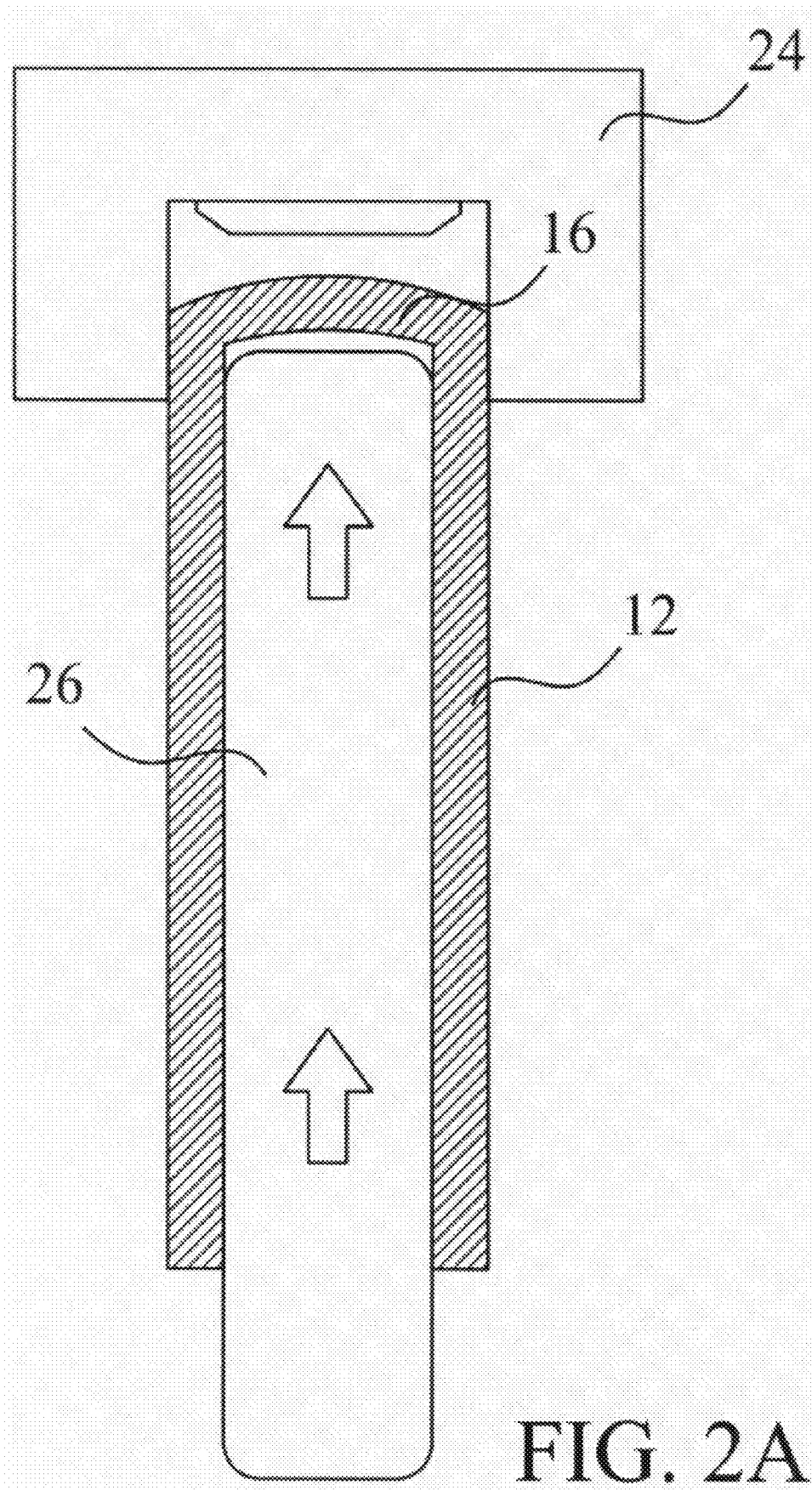
Figure 2B:
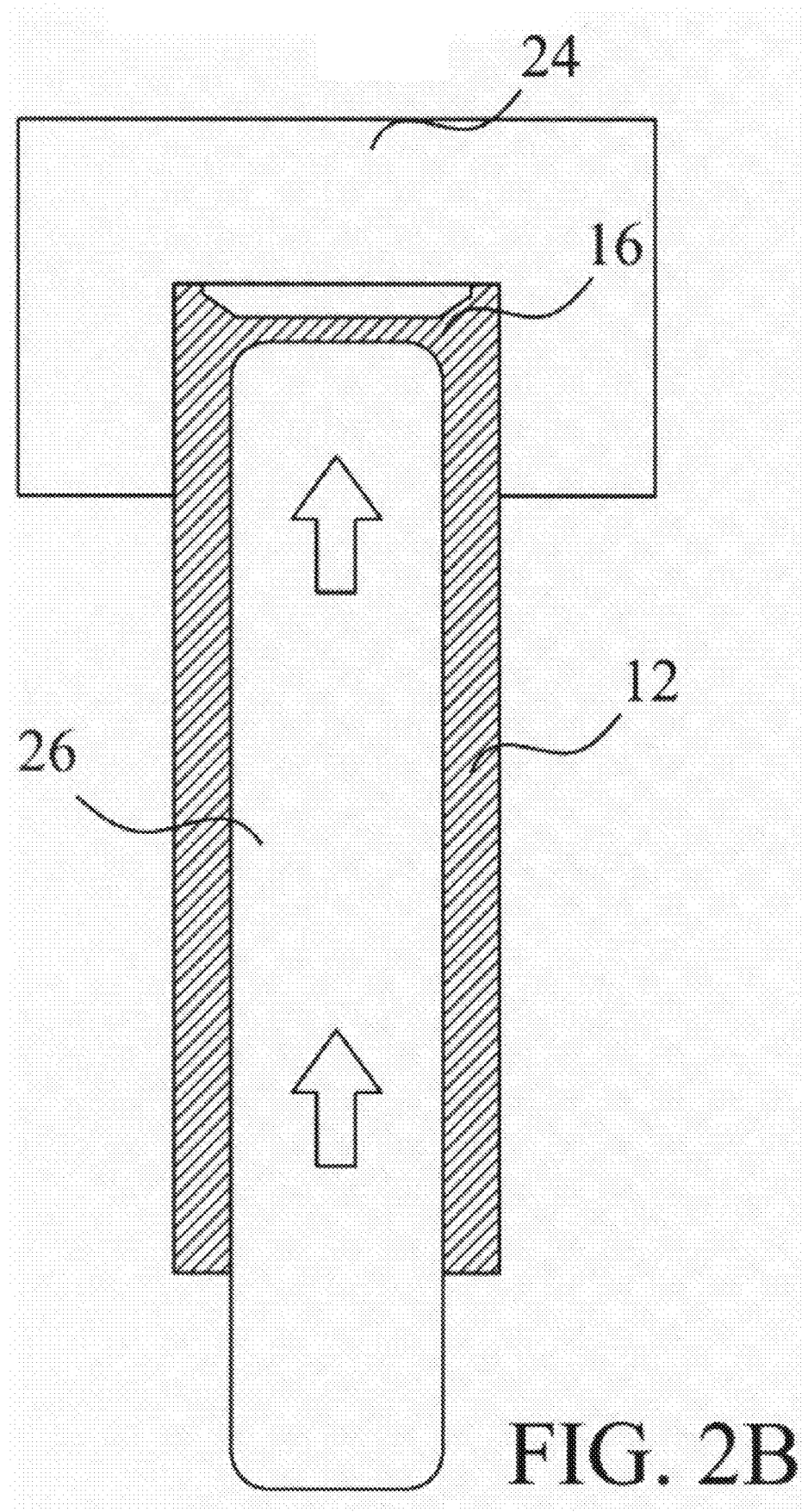

Referring to FIG. 2A, as shown in FIG. 2A, the sealed end 16 of the pipe body 12 is first fixed within the female mold 24, and the male mold 26 is inserted into the pipe body 12. Then, as shown in FIG. 2B, by use of the male mold 26, press the sealed end 16 of the pipe body 12 with respect to the female mold 24 to form a planished surface at the sealed end 16 of the pipe body 12. At this point, the pipe body 12 that has the planished end surface is finished.

Then, the pipe body, which has the planished end surface, is produced into a heat pipe. A central bar is provided, and the diameter of the central bar is smaller than the diameter of the pipe body.

Figure 2C:
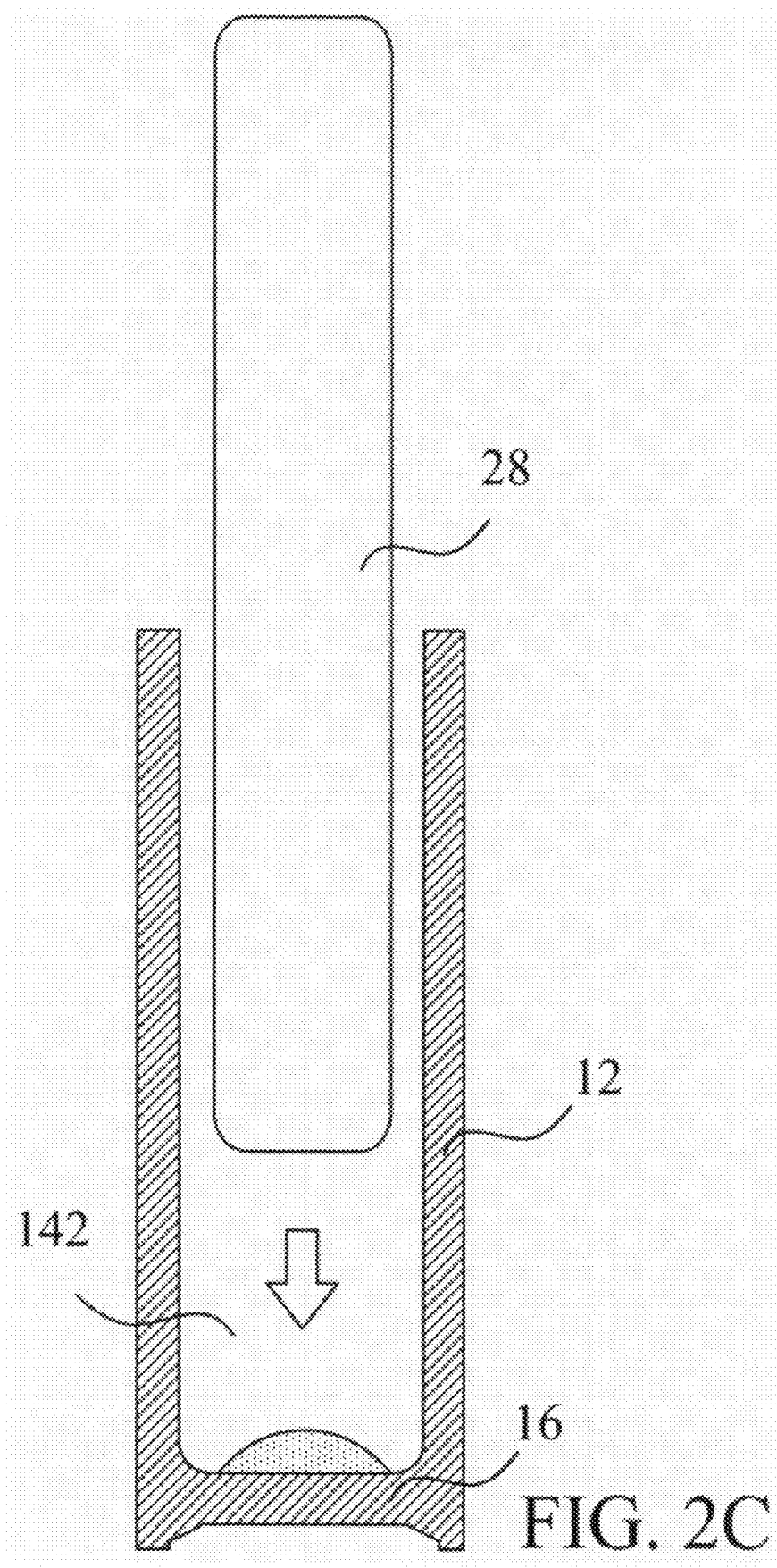
Figure 2D:
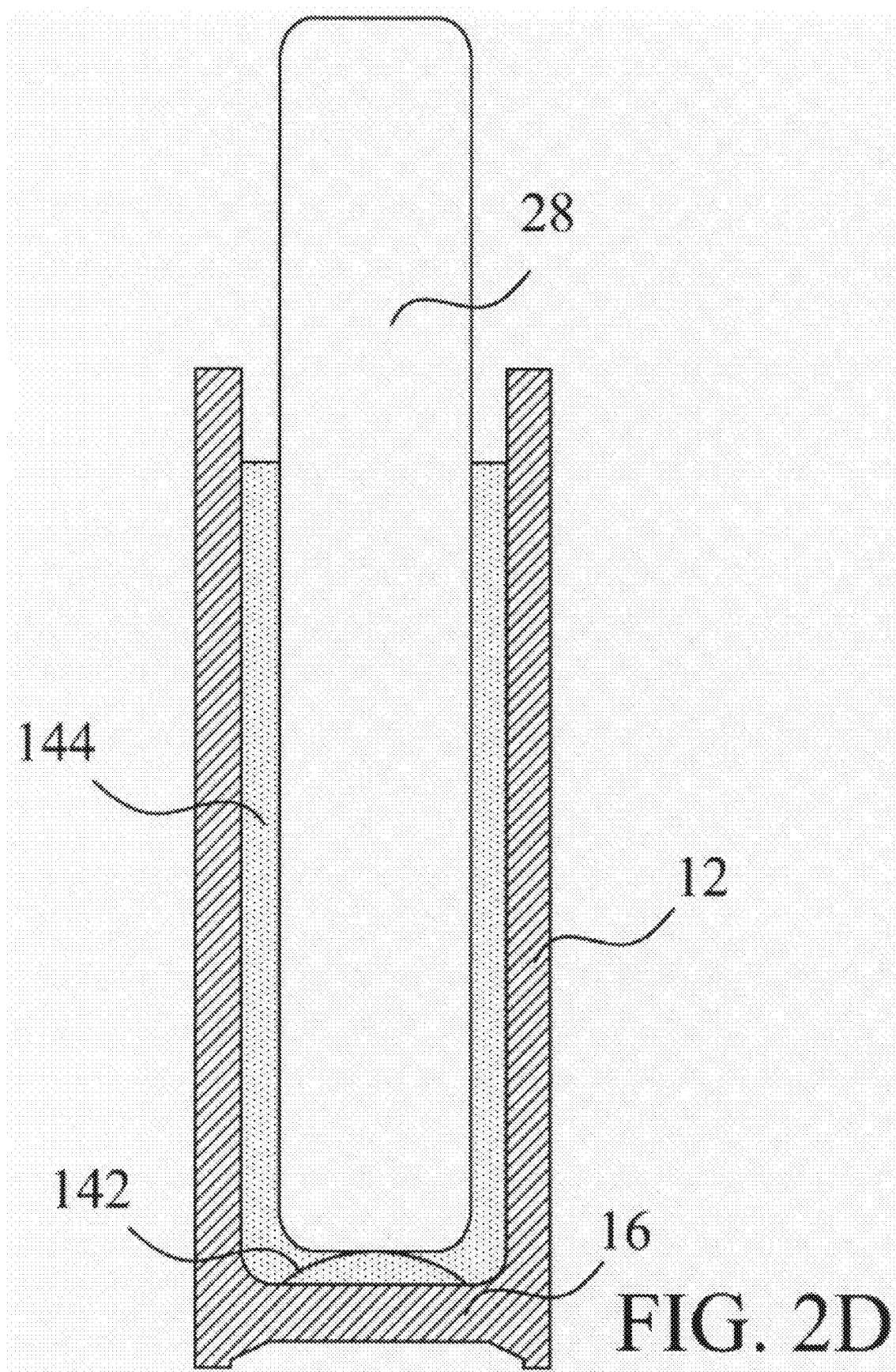
Figure 2E:
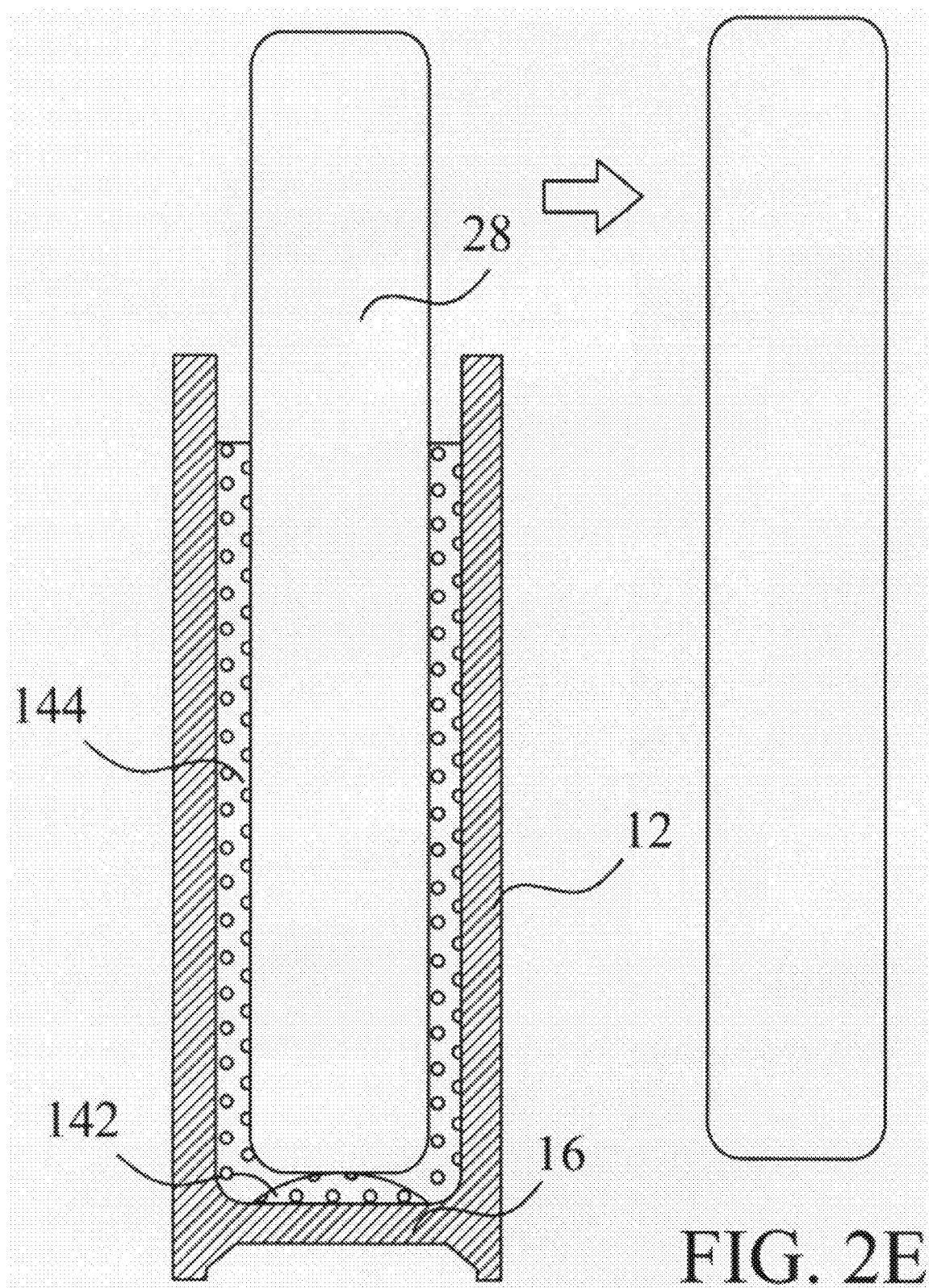
Figure 2F:
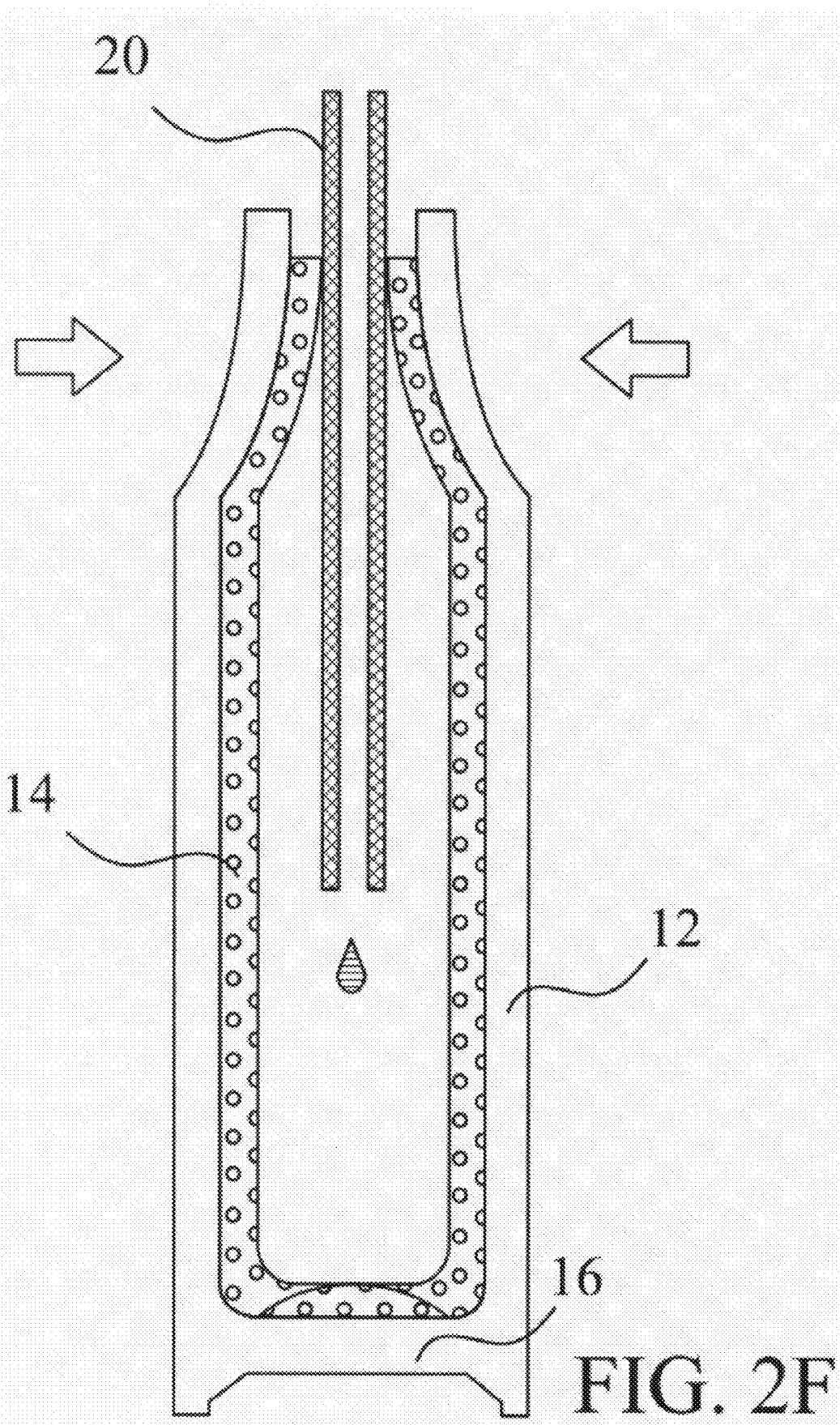

Referring to FIG. 2C, as shown in FIG. 2C, a first metal powder 142 is placed into the pipe body 12, the central bar 28 is inserted into the pipe body 12 from the open end of the pipe body 12, and it presses against the first metal powder 142. As shown in FIG. 2D, a second metal powder 144 is filled between the pipe body 12 and the central bar 28. Then, as shown in FIG. 2E, a sintering process is executed to fuse the second powder 144 with the first powder 142, thus forming a porous capillary diversion layer 14 on the inner wall of the pipe body 12. The central bar 28 is then taken out from the pipe body 12. Referring to FIG. 2F, as shown in FIG. 2F, a working fluid is injected into the pipe body 12 by using a tubule 20. Finally, vacuum the pipe body 12 and seal the open end of the pipe body 12. Then, the heat pipe shown in FIG. 2G is finished.

The first powder and the second powder can be a copper powder, a nickel powder, a silver powder, a metal powder of which the surface is plated with copper, nickel or silver, or other similar metal powder.

In one embodiment, the inner wall of the pipe body that has the planished end surface has a plurality of tiny nicks which form an initial porous capillary diversion layer on the pipe wall. The manufacturing method of the heat pipe made from the pipe body with the planished end surface comprises the following steps. First, place a first metal powder into the pipe body, and insert the central bar into the pipe body from the open end of the pipe body and against the first metal powder. Then, execute a sintering process to fuse the metal powder with the initial porous capillary diversion layer located at the periphery of the inner wall of the pipe body, and form a porous capillary diversion layer which covers and comprises the inner wall of the sealed end of the metal pipe. Take the central bar out from the pipe body and inject a working fluid into the pipe body by using of a tubule. Finally, vacuum the pipe body and seal the open end of the pipe body.

In one embodiment, the manufacturing method of the heat pipe made from the pipe body, which has the planished end surface, manufactures a plurality of tiny nicks by using a mechanical process to form a porous capillary diversion layer, it then injects a working fluid into the pipe body by using a tubule. Finally, the pipe body is vacuumed, and the open end of the pipe body is sealed.

In one embodiment, the manufacturing method of the heat pipe made from the pipe body, which has the planished end surface, is described below. First, sinter a plurality of metal particles on the inner wall of the pipe body, and dispose a metal net on the inner wall to form a porous capillary diversion layer. Similarly, inject a working fluid into the pipe body by using a tubule, and vacuum the pipe body. Finally, seal the open end of the pipe body, and the heat pipe, which has a planished end surface is finished.

In one embodiment, the manufacturing method of the heat pipe made from the pipe body, which has the planished end surface is described below. First, lay a corrugated metal wire cloth on the inner wall of the pipe body, and dispose a flat metal net cloth on the inner wall to form a porous capillary diversion layer. Inject a working fluid into the pipe body by using a tubule, and vacuum the pipe body; then, seal the open end of the pipe body. The shape of the corrugated metal wire cloth is in triangular form, rectangular form, trapezoid form, or flexuous form.

In one embodiment, the shape of the planished end surface is tabular or fluted. The pipe body is made of a copper metal, a nickel metal, a silver metal, or other similar metal materials.

In one embodiment, the electronic device connected to the heat pipe can be a light emitting diode, a laser diode, or an integrated circuit.

In practical application, when stamping the planished surface of the pipe body, the pipe body may be broken due to excess deformation. By heating the pipe body and increasing the flexibility by heat pressing, this can avoid forming cracks on the pipe body caused by stamping.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method for manufacturing a heat pipe with a planished end surface, the heat pipe comprising a pipe body having a sealed end and an open end said method comprising the steps of:

providing a female mold having a flat bottom surface, the female mold also being adapted to receive the sealed end of the pipe body;

providing a male mold having a flat top surface corresponding to the bottom surface of the female mold, the male mold also being adapted to be inserted into the pipe body from the open end of the pipe body;

fixing the sealed end of the pipe body within the female mold;

inserting the male mold into the pipe body;

by use of the male mold, pressing the sealed end of the pipe body with respect to the female mold to form the planished end surface, for mounting an electronic device, at the sealed end of the pipe body;

providing a central bar, wherein a diameter of the central bar is smaller than a diameter of the pipe body;

placing a first metal powder into the pipe body, inserting the central bar into the pipe body from the open end of the pipe body and pressing the bar against the first metal powder;

filling a second metal powder between the pipe body and the central bar, executing a sintering process to fuse the second powder with the first powder, and forming a porous capillary diversion layer at an inner wall of the metal pipe body;

taking the central bar out from the pipe body;

injecting a working fluid into the pipe body by using a tubule; and vacuuming the pipe body and sealing the open end of the pipe body, whereby after the heat pipe is manufactured, the electronic device is capable of being mounted on the planished end surface at the sealed end of the heat pipe.

2. The method of claim 1, wherein the first powder and the second powder can be a copper powder, a nickel powder, a silver powder, a metal powder of which the surface is plated with copper, nickel or silver, or other similar metal powder.

3. The method of claim 1, wherein the inner wall of the pipe body having the planished end surface has a plurality of tiny nicks which form an initial porous capillary diversion layer thereon, the manufacturing method of the heat pipe made from the pipe body with the planished end surface comprises the steps of:

provinging the central bar, wherein the diameter of the central bar is smaller than the diameter of the pipe body;

placing the first metal powder into the pipe body, inserting the central bar into the pipe body from the open end of the pipe body and pressing the bar against the first metal powder;

executing the sintering process to fuse the second metal powder with the porous capillary diversion layer located at a periphery of the inner wall of the pipe body, and forming the porous capillary diversion layer which covers and comprises the inner wall of the sealed end of the metal pipe;

taking the central bar out from the pipe body;

injecting the working fluid into the pipe body by using the tubule; and vacuuming the pipe body and sealing the open end of the pipe body.

4. The method of claim 3, wherein the first powder and the second powder can be a copper powder, a nickel powder, a silver powder, a metal powder of which the surface is plated with copper, nickel or silver, or other similar metal powder.

5. (Original/Reinstated) The method of claim 1, wherein the manufacturing method of the heat pipe made from the pipe body having the planished end surface comprises the steps of:

manufacturing a plurality of tiny nicks by using of a mechanical process to form the porous capillary diversion layer;

injecting the working fluid into the pipe body by using the tubule; and vacuuming the pipe body and sealing the open end of the pipe body.

6. The method of claim 1, wherein the manufacturing method of the heat pipe made from the pipe body with the planished end surface comprises the steps of:

sintering a plurality of metal particles on the inner wall of the pipe body, and disposing a metal net on the inner wall to form the porous capillary diversion layer;

injecting the working fluid into the pipe body by using the tubule; and vacuuming the pipe body and sealing the open end of the pipe body.

7. The method of claim 1, wherein the manufacturing method of the heat pipe made from the pipe body with the planished end surface comprises the steps of:

laying a corrugated metal wire cloth on the inner wall of the pipe body, and disposing a flat metal net cloth on the inner wall to form the porous capillary diversion layer;

injecting the working fluid into the pipe body by using the tubule; and vacuuming the pipe body and sealing the open end of the pipe body.

8. The method of claim 7, wherein a shape of the corrugated metal wire cloth is in triangular form, rectangular form, trapezoid form, or flexuous form.

9. The method of claim 1, wherein a shape of the planished end surface is tabular or fluted.

10. The method of claim 1, wherein the pipe body is made of a copper metal, a nickel metal, a silver metal, or other similar metal materials.

11. The method of claim 1, wherein the electronic device is one selected from the group consisting of a light emitting diode, a laser diode, and an integrated circuit.

* * * * *